United States Patent
Rolland (10) Patent No.: US 9,490,697 B2
(45) Date of Patent: Nov. 8, 2016

(54) SELF-BOOTSTRAP DRIVING CIRCUIT AND DC-DC CONVERTER

(75) Inventor: Eric Rolland, Grepiac (FR)

(73) Assignee: Freescale Semiconductor, Inc., Austin, TX (US)

( * ) Notice: Subject to any disclaimer, the term of this patent is extended or adjusted under 35 U.S.C. 154(b) by 419 days.

(21) Appl. No.: 14/358,741

(22) PCT Filed: Dec. 5, 2011

(86) PCT No.: PCT/IB2011/003189
§ 371 (c)(1),
(2), (4) Date: May 16, 2014

(87) PCT Pub. No.: WO2013/084017
PCT Pub. Date: Jun. 13, 2013

(65) Prior Publication Data
US 2015/0326114 A1    Nov. 12, 2015

(51) Int. Cl.
*H02M 3/155* (2006.01)
*H03K 17/687* (2006.01)
*H02M 1/08* (2006.01)
*H03K 17/06* (2006.01)

(52) U.S. Cl.
CPC ............... *H02M 3/155* (2013.01); *H02M 1/08* (2013.01); *H03K 17/063* (2013.01); *H03K 17/687* (2013.01); *H03K 2217/0063* (2013.01); *H03K 2217/0081* (2013.01); *Y10T 307/406* (2015.04)

(58) Field of Classification Search
CPC ...................................................... H02J 1/102
USPC ........................................................... 307/31
See application file for complete search history.

(56) References Cited

U.S. PATENT DOCUMENTS

| 6,897,643 | B2 | 5/2005 | Stone |
| 7,221,129 | B2 | 5/2007 | Matsuo et al. |
| 2010/0201305 | A1 | 8/2010 | Petroianu et al. |
| 2011/0043176 | A1 | 2/2011 | Soham |
| 2011/0260539 | A1 | 10/2011 | Wai et al. |

OTHER PUBLICATIONS

M. Belloni et al: "A 4-Output Single-Inductor DC-DC Buck Converter with Self-Boosted Switch Drivers and 1.2A Total Output Current", 2008 IEEE International Solid-State Circuits Conference, ISSCC 2008 / Session 24 / Analog Power Techniques / 24.6, pp. 444-626.
International Search Report and Written Opinion correlating to PCT/IB2011/003189 dated Aug. 14, 2012.

*Primary Examiner* — Robert Deberadinis
(74) *Attorney, Agent, or Firm* — Charlene R. Jacobsen (57) ABSTRACT

A self-bootstrap driving circuit includes a first input receiving a first control signal; an output, to which a load having an electro-inductive component may be connected; a power switch having first and second current terminals and a control terminal, and being arranged to drive power from a power supply terminal to the load; a bootstrap circuitry arranged to drive the control terminal of the power switch based on the control signal; and a current path between the electro-inductive component of the load and the control terminal of the switch, said current path being arranged to provide direct transfer from said electro-inductive component to said control terminal of the switch of an overvoltage generated at the electro-inductive component to provide an overdrive voltage to said control terminal of the switch.

12 Claims, 4 Drawing Sheets

SELF-BOOTSTRAP DRIVING CIRCUIT AND DC-DC CONVERTER

FIELD OF THE INVENTION

This invention relates to a self-bootstrap driving circuit and a DC-DC converter.

BACKGROUND OF THE INVENTION

The Buck and Buck-Boost DC-DC converters use a high side (HS) power switch toggling between the rail-to-rail of the main power supply, that is to say between the potential at the ground terminal, namely 0 volts and the potential at the positive supply terminal, namely Vsup. When this HS power switch is a MOSFET, its gate may need to be driven with a voltage above the Vsup level. In the automotive domain, the minimum Vsup level has kept becoming lower and lower over the years, from 4.5 volts to 3.5 volts, and even to 2.5 volts nowadays. In these conditions, it is more and more difficult to generate a sufficient Gate-Source voltage (Vgs) overdrive for the HS MOSFET.

When this Vgs overdrive is not sufficient to conveniently drive the HS MOSFET, the conduction losses across the HS MOS FET (Metal Oxide Semiconductor Field Effect Transistor) increase and negatively impact the power efficiency. This degradation on the power efficiency as a function of the reduction in Vsup is particularly true for the Buck topology at low values of Vsup because, in this mode, the current sunk from the power supply and the duty cycle become higher (for providing constant output load current).

These drawbacks need to be compensated, e.g., by an over-sizing of the HS MOSFET, and/or by an expensive Charge Pump structure which requires additional pins, and/ or additional external capacitors.

The document entitled "A 4-Output Single-Inductor DC-DC Buck Converter with Self-Boosted Switch Drivers and 1.2 A Total Output Current", Solid-State Circuits Conference, 2008, ISSCC 2008, Digest of Technical Papers, IEEE International, Issue Date: 3-7 Feb. 2008, pp. 444-626 (ISBN: 978-1-4244-2010-0; INSPEC Accession Number: 10047949; Digital Object Identifier: 10.1109/ ISSCC.2008.4523248), teaches the use of the anti-crossing phase of a SIMO (Single Inductor Multiple Output) DC-DC Buck converter to create a boost voltage used by the output low side (LS MOSFET). This solution, however, requires expensive internal and external capacitors.

SUMMARY OF THE INVENTION

The present invention provides a self-bootstrap driving circuit and a DC-DC converter as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
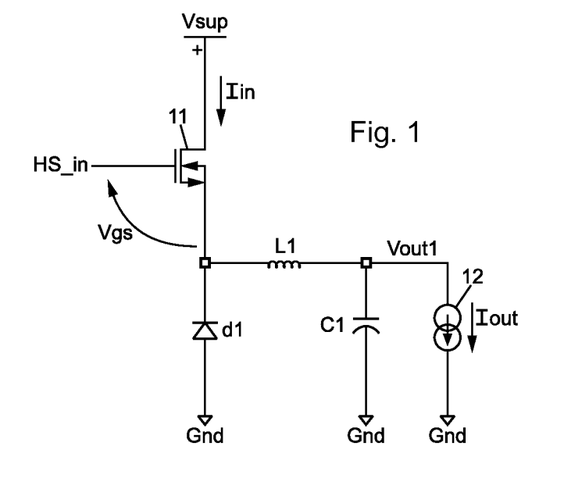
FIG. 1 schematically shows an example of Buck DC-DC converter.

FIG. 1 schematically shows an example of implementation of a Buck DC-DC converter. In the shown example, the converter comprises a switching device, namely a power switch 11 which may be, e.g. a HS MOSFET.

The HS MOSFET may be a NMOS, i.e., a MOSFET of the N type. The switch 11 has a control terminal, or control gate, which is arranged for receiving a control signal HS_in. It further has first and second current terminals, namely drain and source terminals, respectively. The drain terminal is coupled to a positive power supply terminal for receiving a positive supply voltage Vsup. The source terminal is connected to a first terminal of an inductor L1, whose second terminal is connected to a load. In the shown example, the load is represented by a current source 12 driving a load current Iout.

The Buck DC-DC converter further comprises a capacitor C1 connected between the second terminal of inductor L1 and a ground terminal Gnd, as well as a diode d1 connected to the first terminal of inductor L1 by its cathode and to the ground terminal Gnd by its anode.

The operation of the Buck DC-DC converter is the following. Responsive to the input control signal HS_in, which may be a pulse-width modulated binary signal, the power switch 11 is alternately opened and closed, i.e. the HS MOSFET is alternately made blocked and conductive, respectively. Thus, the voltage at the source terminal of the power switch 11 toggles between 0 volts and Vsup.

When the power switch 11 is closed, a current Iin is sunk from the positive supply terminal into the inductor L1, and capacitor C1 is charged by current Iin-Iout. When the power switch is open, no current Iin flows into inductor L1, and capacitor C1 is discharged by current Iout sunk by the load. The current loop including inductor L1 is then closed through diode d1, which operates as a recirculation diode.

When the HS switch is a NMOS device, its gate needs to be driven with a voltage which may be above the Vsup level to ensure that the Gate-Source voltage Vgs is above its forward voltage drop of, e.g. 0.5 volt of the NMOS device. This may require application of an overdrive voltage. In the automotive domain, however, the minimum Vsup level has kept becoming lower and lower over the years, and may nowadays be as low as 2.5 volts. In these conditions, it is more and more difficult to generate a sufficient Vgs overdrive.

When the Vgs overdrive is not sufficient to conveniently drive the HS MOSFET, the conduction losses across the HS MOSFET (which are given by $Rds_{ON} \times Iin$) increase and negatively impact the power efficiency. This degradation on the power efficiency as a function of the reduction in Vsup is particularly true for the Buck topology at low values of Vsup because, in this mode, the current sunk from the power supply and the duty cycle of signal HS-in become higher (for providing a constant output load current).

Figure 2A:
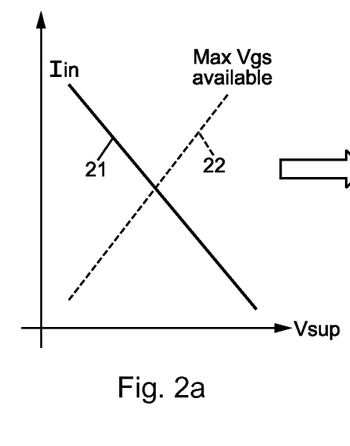
FIGS. 2a and 2b are graphs showing the input current, the gate voltage, the internal resistance and the power efficiency of a MOSFET device as a function of the positive supply voltage.

More precisely, when Vsup decreases in an DC-DC Buck structure, the current Iin sunk from the power supply terminal through the current path of the HS MOSFET increases, and the capability to guarantee availability of the gate-source voltage conduction voltage Vgs of this HS switch decreases, as shown in FIG. 2a by graphs 21 and 22, respectively.

Figure 2B:
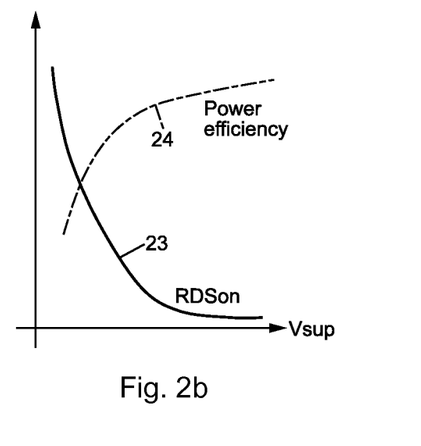

For these both reasons, the internal resistance $Rds_{ON}$ of the HS switch and the overall power efficiency of the DC-DC converter can be extremely impacted at low values of Vsup, as shown in FIG. 2b by graphs 23 and 24, respectively.

These drawbacks need to be compensated, e.g., by an expensive Charge Pump (CP) structure and/or by an oversizing of the HS MOSFET.

Figure 3:
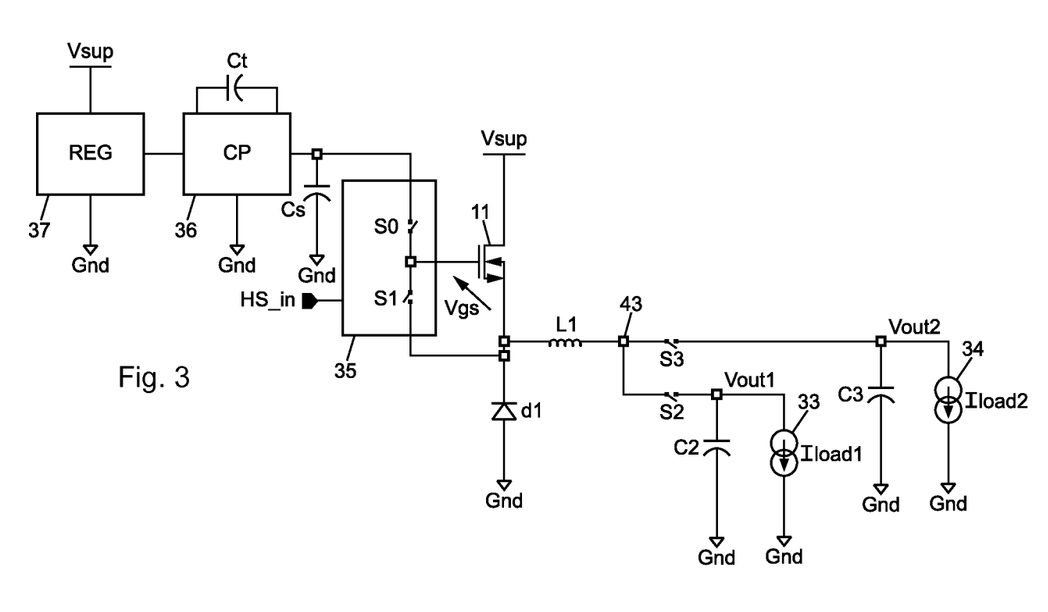
FIG. 3 schematically shows an example of a DC-DC converter with a MIMO topology having a conventional self-bootstrap driving circuitry.

As shown in the example of FIG. 3, the degradation of the Vgs overdrive at low values of Vsup may be compensated by solutions based on a CP structure, with or without external components. Such approaches could be pursued, but are not necessarily approaches that have been previously conceived or pursued. Therefore, the approach described in what follows is not prior art to the claims in this application and are not admitted to be prior art by inclusion in this description.

In the example of a solution based on a CP structure as shown in FIG. 3, the switching device comprising the power switch 11 of FIG. 1 is used in a DC-DC converter, having e.g. a Single Inductor Multiple Output (SIMO) topology. In this topology, the second terminal 43 of inductor L1 is connected to at least a first load 33 and a second load 34, through a first switch S2 and a second switch S3, respectively. In the shown example, the loads 33 and 34 are represented by current sources which sink a load current Iload1 and Iload2, respectively. A first capacitor C2 is connected to the node between the switch S2 and the load 33 by a first terminal, and to the ground terminal Gnd by a second terminal. Similarly, a second capacitor C3 is connected to the node between the switch S3 and the load 34 by a first terminal, and to the ground terminal Gnd by a second terminal. In operation, switches S2 and S3 are controlled by control signals CS(S2) and CS(S3) respectively, so that the loads are successively coupled to the output of the inductor L1, only one at a time.

A bootstrap circuitry 35 is arranged for generating an overdrive voltage at the control terminal, i.e., gate of the power switch 11. The function of the bootstrap circuitry is to charge, namely pre-charge, the gate of the corresponding HS MOSFET to a given voltage level. It transposes an input voltage, which is referenced to the ground potential, into an output voltage of same value but referenced to the source of the HS MOSFET. In addition, the bootstrap circuitry controls the switching of the HS MOSFET based on an input control signal HS_in.

In order to fulfill its function, the bootstrap circuitry 35 comprises a controlled switch S1 connecting the gate terminal and the source terminal of this HS MOSFET, and a further switch S0 connecting said gate terminal and the output of a charge pump circuitry 36. In the shown implementation, the input voltage of the bootstrap circuitry is the output voltage of the charge pump circuitry 36, which is available across a parallel storage capacitor Cs. Due to its size, the storage capacitor Cs is usually implemented as an external component, that is to say a component external to the circuit and connected to the circuitry 36 via dedicated pins.

The implementation of the charge pump needs not to be described in details here, but it will become apparent to the one with skills in the art that such a circuit includes, in addition to the circuitry 36 and the storage capacitor Cs, a transfer capacitor Ct which is also commonly a component external to the circuit. The charge pump circuitry 36 receives an input voltage from a pre-regulator circuit 37, which is supplied by Vsup with reference to the ground potential.

The type of solution as described above with reference with FIG. 3 is expensive because it impacts at least:
- the die-size of the circuit, due to the additional pre-regulator and charge pump circuitry;
- the pin-out characteristics, that is to say the number of external pins of the circuit, due to the addition of external components including the transfer capacitor and the storage capacitor; and,
- the overall Build-Of-Material (BOM) of the circuit, further resulting from the addition of the above components.

Electro-Magnetic Compatibility (EMC) needs to be further mentioned, as a drawback of this type of solution, since the frequency of operation of the charge pump may lie in the range of 20-30 mega-Hertz.

In addition, even if the conduction losses are improved by a better Vgs overdrive, the overall efficiency remains low due to the poor capability of the charge pump.

Figure 4:
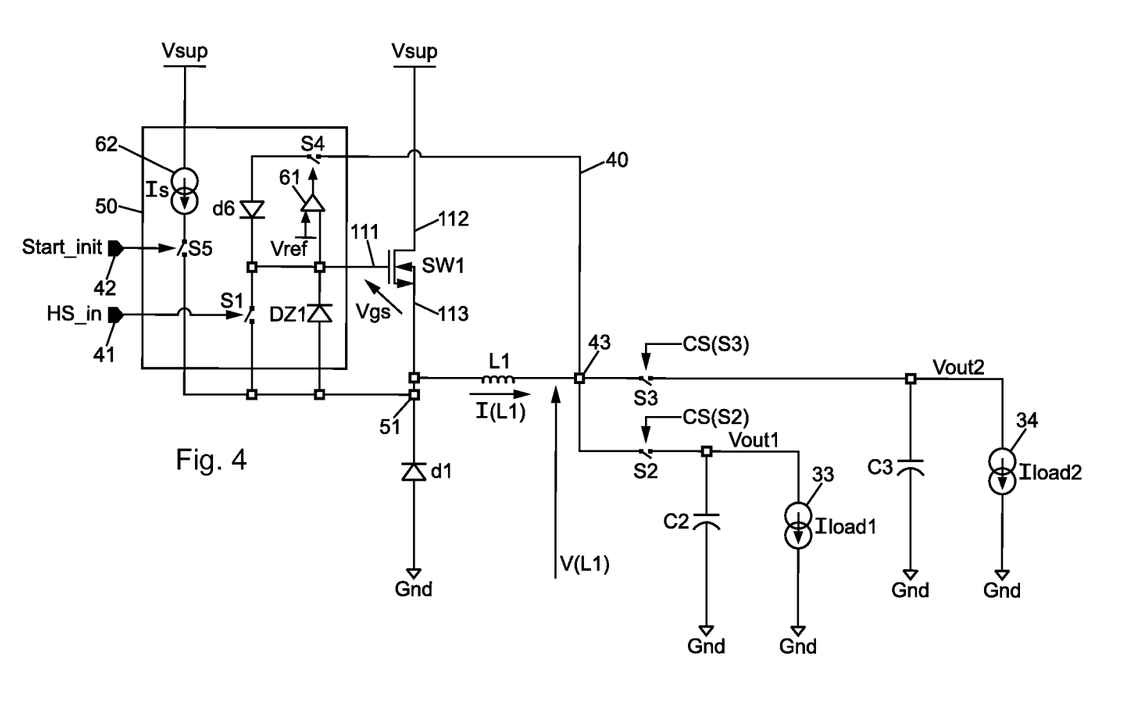
FIG. 4 schematically shows an example of embodiment of a DC-DC converter with a MIMO topology, having an example of embodiments of the self-bootstrap driving circuitry.

FIG. 4 schematically shows an example of embodiments of a DC-DC Buck converter with a SIMO topology, having an example of embodiment of the proposed self-bootstrap driving circuitry. However, it will be appreciated that the principle of the invention is not limited to a SIMO DC-DC Buck converter, nor actually to a DC-DC converter in itself. Other examples of applications in which the proposed bootstrap circuitry may be implemented will be explicated below.

In the shown example, the SIMO DC-DC Buck converter is the same as in FIG. 3. In particular, the second terminal 43 of inductor L1 is connected to at least a first load 33 and a second load 34, through a first switch S2 and a second S3, respectively. In the shown example, the loads 33 and 34 are represented by current sources which sink a load current Iload1 and Iload2, respectively, to the ground terminal Gnd. A first capacitor C2 is connected to the node between the switch S2 and the load 33 by a first terminal, and to the ground terminal Gnd by a second terminal. Similarly, a second capacitor C3 is connected to the node between the switch S3 and the load 34 by a first terminal, and to the ground terminal Gnd by a second terminal.

It will be appreciated that the number of loads which may thus be selectively driven by the power switch 11 through switches S2 and S3 is not limited to the example shown in FIG. 4 with two loads. This number equals N, where N is an integral number greater than unity.

It will further become apparent to the one with ordinary skills in the art that, in the background of SIMO DC-DC converters, it is mandatory to avoid that both output switches S2 and S3 are in the ON state together, namely at the same time. To that end, an anti-overlapping feature is provided by a logic suitable for the given implementation, which results that, for instance the high levels of control signals CS(S2) and CS(S3) cannot overlap. However, when both switches are OFF and the inductor L1 is charged, an over-voltage is generated at the output 43 of the inductor L1.

The idea underlying the proposed embodiments consists in taking advantage of this existing anti-overlapping feature, and/or in creating a specific anti-overlapping control of switches S2 and S3 synchronous with the ON command of the HS MOSFET, in the purpose of using the over-voltage created by the inductor to overdrive the gate of the HS MOSFET.

The self-bootstrap driving circuit 50 shown in FIG. 4 comprises a first input 41 receiving a first control signal HS_in, and an output 51 to which a load having an electro-inductive component may be connected. In the shown example, the electro-inductive component is the inductor L1 of the SIMO DC-DC converter. It shall be appreciated, however, that the electro-component may be any inductive component suitable for the specific implementation such as, for instance, a switched inductor of other types of DC-DC converters, or a coil of an electric motor.

The circuit further comprises a power switch SW1 having first and second current terminals 112 and 113 and a control terminal 111, and arranged to drive power to the loads including the single electro-inductive component L1, from the power supply terminal at Vsup voltage.

In the shown example, wherein the power switch SW1 is e.g. a High Side (HS) or gigh side configured switch, said switch SW1 comprises a HS MOSFET. Also, in the shown embodiment, the HS MOSFET is an N-type MOSFET, namely a NMOS. In other embodiments, however, the power switch may also be, or include semiconductor devices other than a MOSFET, such as for example another type of FET e.g. a junction FET (J-FET), an Insulated Gate Bipolar Transistor (IGBT), a Bipolar Junction Transistor (BJT), a High Electron Mobility Transistor, or any other suitable semiconductor device.

The circuit further includes a bootstrap circuitry 50 is arranged to drive the control terminal 111, for instance the gate, of the power switch SW1 based on the control signal HS-in. Details of an example of embodiment of the bootstrap circuitry 50 will become apparent from the description below.

Still further, the circuit has a current path 61 between the inductor L1 of the load arrangement and the control terminal 111, of the power switch SW1. This current path 61 is arranged to provide direct transfer from the output of said electro-inductive component L1 to the control terminal gate 111 of the switch SW1, of an overvoltage generated at inductor L1 to provide said control terminal of the switch with an overdrive voltage. The expression "direct transfer" applied to the current path 61 is to be understood as meaning that the electric charges are not stored in any capacitor that would be connected in parallel, namely between the output of the inductor L1 (or the gate 111 of the HS MOSFET SW1 or somewhere in-between along the current path 61 from said output to said gate) and the ground terminal Gnd.

As will be apparent to the one with ordinary skills in the art, the proposed direct transfer of charges from the inductor output to the power switch control gate allows achieving a sufficient gate overdrive for the power switch, especially at low values of Vsup. This maximizes its internal resistance $Rds_{ON}$, thus reducing the conduction losses and consequently increasing the overall system efficiency.

With the proposed solution, this is achieved nicely because the over-voltage generated by the inductor, and then the Vgs overdrive, are independent of the Vsup voltage level. The only condition to be met is that the minimum quantity of charges needed by the gate of the power switch SW1 is stored into the inductor. This condition is automatically met when the system works in close loop mode, like it is for the case for 99% of the DC-DC converter systems.

The over-voltage may be applied to the gate of the HS MOSFET through a simple diode d6 of the self-bootstrap circuitry. To this end, diode d6 may be chosen to have high current transient capability. It may be implemented, for instance as a diode connected transistor. When the gate of the HS MOSFET is charged to the expected voltage level, the switches S2 and S3 can be allowed to continue their normal sequencing suitable for the given implementation. In this case, the gate of the HS MOSFET will be maintained approximately constant until it is discharged by switch S1 when the HS MOSFET needs to be switched-off.

As indicated, this system is capable to guarantee a 100% duty cycle for the HS switch as long as the switches S2 and/or S3 are controlled so as to be open simultaneously at some times.

The proposed solution offers a gate overdrive capability for the power switch which, in contrast with the solution according to the IEEE paper mentioned in the "Background of the invention" section, avoids the expensive charge storage and charge transfer capacitors.

In the shown embodiment of the driving circuit according to FIG. 4, the power switch SW1 is a high-side (HS) or high-side configured switch. In other embodiments and/or applications, however, the power switch may also be a low-side (LS) or low-side configured switch.

Compared with a solution presented above with reference to FIG. 3, the proposed solution further offers a significant cost reduction since it decreases the die-size by design simplification (since no pre-regulator and charge pump circuitry are needed), limits the BOM due to the not needed internal or external transfer or charge pump capacitors and expensive charge pump structure, and avoids additional pins, nor over-sizing of the HS MOSFET.

In addition, the proposed circuitry can be used it all the type of high efficiency Buck and Buck-Boost converters, not only with a SIMO topology, ensuring even a 100% duty cycle for the control of the power switch without additional components.

Finally, the proposed solution makes it possible to address the design of both High Side (HS) and Low Side (LS) drivers.

In some embodiments, as shown in FIG. 4, the driving circuit may further comprise a clamping circuitry arranged to clamp the overvoltage to a given clamping threshold. The clamping circuitry thus allows adapting the overvoltage for power switches that cannot make use of, or may be damaged by the full voltage range of the overvoltage.

In the shown example, the clamping circuitry is coupled to the control terminal of the power switch. However, this is only an example. In a variant, indeed, the clamping circuitry may be coupled to the output of the electro-inductive component L1, with selective means being further provided so that the clamping circuitry is operative only when necessary to protect the switch from overvoltage above the clamping threshold. More generally, the clamping circuitry may be arranged anywhere in the current path between the output of the electro-inductive component L1 and the control terminal 111 of the power switch.

In the driving circuit as shown in FIG. 4, the clamping circuitry comprises e.g. a Zener device, for instance a Zener diode DZ1. In the shown embodiment, the Zener diode DZ1 is connected to the control terminal 11 of the power switch SW1 by its cathode, and to the ground terminal Gnd by its anode. This Zener diode DZ1 may thus be comprised in the bootstrap circuitry as in the shown example, but this is not mandatory.

The clamping circuitry allows protecting the switch from overvoltage above the clamping threshold, since the excess of voltage is clamped by the Zener diode DZ1, thus limiting the Vgs voltage of the HS MOSFET to what is needed only.

Due to the fact that a current through the inductor is needed to start the system upon power-up of the system, the proposed solution may implement a specific start-up circuitry. A simple and efficient approach can consist in forcing an initialization or start current Is through the inductor L1

Therefore, a start-up circuitry may be arranged to provide a current within the electro-inductive component L1 during an initialization phase. This circuitry may comprise a controlled DC current source 62 in series with a control switch S5. In the shown example, the start-up circuitry is comprised in the bootstrap circuitry, but this is by no way mandatory. It is activated by an initialization signal Start_Init which may be received through an input 42 of the bootstrap circuitry 50.

The current source 62 may thus be controlled by a control signal Start_init which may control the opening and closing of the switch S5. As soon as enough current has flown through the inductor L1, the self bootstrap circuitry 50 can operate freely and the current source can be switched off, e.g. by de-asserting the control signal Start_init thus opening the control switch S5.

The current path 61 may comprise at least one of the following components connected in series within said current path: a diode with an anode terminal turned to the output of the electro-inductive component and a cathode terminal turned to the control terminal of the power switch, a controlled switch, a capacitor, and a resistor.

It will be apparent to the one with ordinary skills in the art that the current through the Zener diode DZ1 is theoretically equal to the current into the inductor L1. Thus, it could be really high compared to the real current needed to charge the gate of the power switch SW1.

Therefore an improvement can be achieved by having a clamp detection circuitry to inform the system that the gate of the power switch SW1 is charged at the expected level, e.g. 10 volts in the example, and that normal activation of switches S2 or S3 can be resumed.

In some embodiments, indeed, the driving circuit may further comprise:
- a clamp detection circuitry arranged for detecting that the voltage at the control terminal of the power switch is clamped to the clamping threshold; and,
- a control switch S4 arranged in series within the current path 40.

The clamp detection circuitry may comprise a comparator 61 arranged to control the opening of the control switch S4 responsive to the voltage at the control terminal 111 of the power switch SW1 being clamped to the clamping threshold defined by the Zener diode DZ1. To that end, a first input of the comparator 61 may be connected to the control terminal 111 of the power switch SW1, the second input of said comparator 61 receiving a reference voltage Ref equal to the clamping threshold provided by the Zener diode DZ1, for instance 10 volts.

This way, the clamp detection circuitry permits to optimize the duration of the anti-overlapping phase of operation for switches S2 and S3, which phase is detrimental to the overall system efficiency.

FIGS. 5a-5e show timing diagrams of examples of signals used for operating the DC-DC Buck converter of FIG. 4.

Figure 5A:
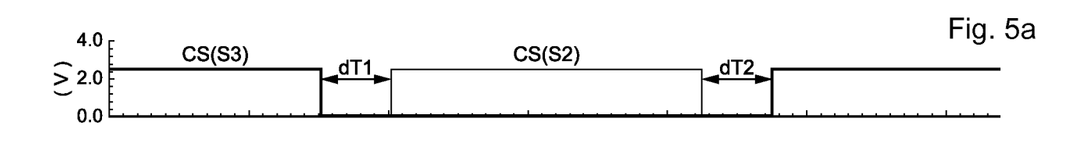
FIGS. 5a-5e are timing diagrams of examples of signals used for operating the DC-DC converter of FIG. 4.

As was already explicated in the above, in the context of a SIMO DC-DC converter, an anti-overlapping logic prevents the output switches S2 and S3 from being in the ON state at the same time, to avoid destruction of the switches. The control signals CS(S2) and CS(S3) controlling the ON/OFF state of switches S2 and S3, respectively, are shown in the diagram of FIG. 5a. As can be seen on this timing diagram, there is a guard interval dT1 between the time when CS(S3) is de-asserted and the time when CS(S2) is asserted, to avoid overlapping of these signals in all circumstances. Similarly, there is a guard interval dT2 between the time when CS(S2) is de-asserted and the time when CS(S3) is asserted again.

Figure 5B:
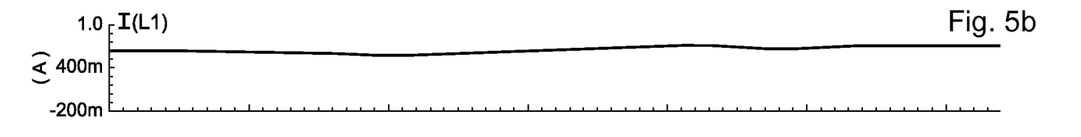
Figure 5C:
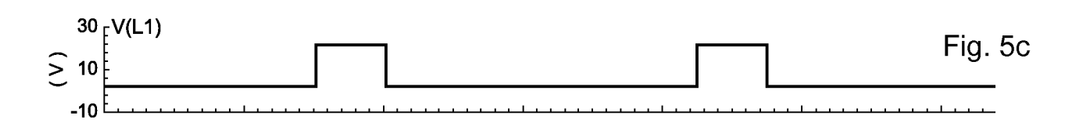

When both switches are OFF and the inductor L1 is charged, an over-voltage is generated at the output of the inductor L1, as can be seen in FIGS. 5b and 5c which show the current I(L1) in the inductor L1 and the voltage V(L1) across said inductor L1, respectively. For instance, the overvoltage at the output of inductor L1 may reach approximately 20 volts, with Vsup being approximately 2.5 volts, for instance.

Figure 5D:
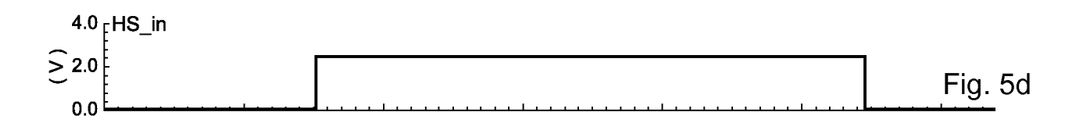

Proposed embodiments take advantage of this existing anti-overlapping feature, by providing that the switching of the HS MOSFET in the ON state by assertion of the HS_in signal, is controlled in synchronism with the generation of this overvoltage, that is to say, ideally, in response to de-assertion of either one of the control signals CS(S2) and CS(S3), as shown in FIG. 5d. Thus, the self-bootstrap circuitry 50 of the embodiments described in the above, allows this overvoltage created by the inductor to the overdrive the control terminal, i.e., gate of the HS MOSFET. The duration of the period of time in which the HS_in signal remains in the ON state depends on the duty cycle of the HS MOSFET control which, in turn, depends on the current consumed in the loads.

In the shown example, the frequency of the switching from one load to the other by control signals CS(S2) and CS(S3) of FIG. 5a is higher that the frequency of the control signal HS_in of the HS MOSFET given in FIG. 5d.

Figure 5E:
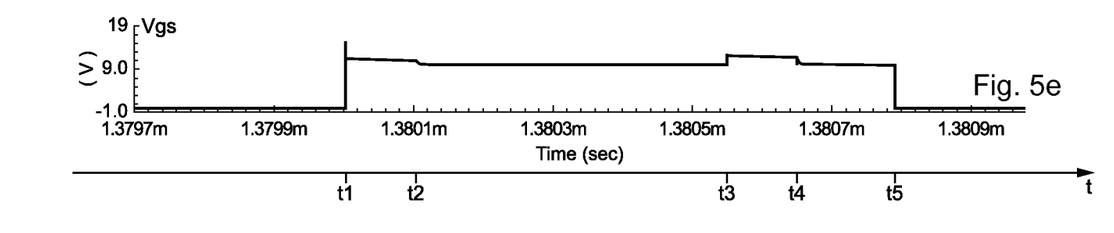

With reference to FIG. 5e, the gate of the HS MOSFET is charged to the expected voltage level of e.g. approximately 10 volts upon assertion of control signal HS_in at time t1 which is made synchronous with the de-assertion of control signal CS(S3), by the overvoltage at the output of inductor L1. As shown in FIG. 5c, this overvoltage lasts until time t2 when control signal CS(S2) is asserted to close the switch S2. From that point in time, the voltage Vgs at the gate of the HS MOSFET remains approximately constant until it is discharged by switch S1 when the HS MOSFET needs to be switched-off by de-asserting signal HS_in at time t5. In the interim, if CS(S2) and CS(S3) happen to be both in the inactive state again, for instance at time t3, then another overvoltage appears at the output of inductor L1 and overdrives the Vgs voltage of the HS MOSFET between time t3 and time t4 through diode d6 in the self bootstrap block 50.

A further aspect of the invention proposes a DC-DC converter comprising at least one inductor and a driving circuit as presented herein above, arranged to drive a load having said inductor as the electro-inductive component.

The DC-DC converter may have a Single Inductor Multiple Outpout (SIMO) topology. The examples of embodiments explicated above with reference to FIGS. 4 and 5a-5e relate to a SIMO DC-DC converter. In this type of topology, the switches S2, S3, . . . , Sn are already present as well as an anti-overlapping logic, so that the implementation of the idea is really straightforward. It will be appreciated that applicability of the idea is not restricted to that kind of DC-DC converter with a SIMO topology.

In some variants, indeed, the DC-DC converter may have a different Buck or a Buck-Boost topology. Unlike DC-DC Buck converters with SIMO topology which already have provision for some instants with switches S2 and S3 being simultaneously opened, other DC-DC converters such as DC-DC Buck or Buck-Boost converters with other topology may need an additional switch to generate the over-voltage.

Further, the idea may also be applied with success to Boost and Buck-Boost DC-DC converters with synchronous rectification. Here also, as soon as there is a synchronous rectification, the switch used to open the inductor output is already present and it just needs to be correctly driven through a convenient logic according to the same approach.

Moreover, the idea may also be successfully implemented in applications different from DC-DC converters, for example in HS drivers for electro-actuator, e.g. electro-valve, DC or BLDC electric motors, etc. . . . Indeed, the electro-inductive component that is used to obtain the over-voltage may be any kind of inductive component used in a switched mode of operation, not specifically the inductor of a Buck or Buck-Boost DC-DC converter.

In one such example of implementation, the self bootstrap driving circuit may be used to drive an inductive coil of an electric motor, for instance a DC motor.

It shall be noted that, in implementations where, for instance, a DC-DC converter or an electric motor drive already has multiple outputs, it may be sufficient to create a specific anti-overlapping control of switches like switches S2 and S3 of FIG. 4, for instance.

In some other implementations, in contrast, the driving circuit may further comprise a dedicated switch in series with the electro-inductive component of the load, which is controlled to be opened so as to generate the overvoltage at said electro-inductive component when needed.

In all cases, the driving circuit comprises at least one controlled switch (like controlled switch S2 and S3 of FIG. 4) in series with the electro-inductive component of the load, which is controlled to be open to generate the overvoltage at an output of said electro-inductive component. Preferably, such generation of the overvoltage may be synchronous with the activation of the power switch so as to fully benefit from the overvoltage.

Advantages of the proposed solution, compared with solutions with additional charge pump as described above with reference with FIG. 3, include:
relatively low impact of die-size
no addition of external components,
no additional pins,
no EMC degradation,
good overall efficiency.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the clamping circuitry and the initialization circuitry may be included or not in the bootstrap circuitry 50.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the loads driven by the inductor L1 of FIG. 4 may be comprised inside the same integrated circuit. Alternatively, the examples may be implemented as any number of separate integrated circuits or separate devices interconnected with each other in a suitable manner. For example, the bootstrap circuitry 50 as shown in FIG. 4 could be comprised in a separate circuit.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A self-bootstrap driving circuit comprising:
a first input receiving a first control signal;
an output, to which a load having an electro-inductive component may be connected;
a power switch having first and second current terminals and a control terminal, and being arranged to drive power from a power supply terminal to the load;
a bootstrap circuitry arranged to drive the control terminal of the power switch based on the control signal;
a current path between the electro-inductive component of the load and the control terminal of the switch, said current path being arranged to provide direct transfer from said electro-inductive component to said control terminal of the switch of an overvoltage generated at the electro-inductive component to provide an overdrive voltage to said control terminal of the switch.

2. The driving circuit of claim 1, further comprising a clamping circuitry arranged to clamp the overdrive voltage to a given clamping threshold.

3. The driving circuit of claim 2, wherein the clamping circuitry is coupled to the control terminal of the power switch.

4. The driving circuit of claim 2, wherein the clamping circuitry comprises a Zener diode.

5. The driving circuit of claim 2, further comprising:
a clamp detection circuitry arranged for detecting that the voltage at the control terminal of the power switch is clamped to the clamping threshold; and,
a first control switch arranged in series within the current path, the clamp detection circuitry being arranged to control the opening of the control switch responsive to the voltage at the control terminal of the power switch being clamped to the clamping threshold.

6. The driving circuit of claim 1, wherein the power switch is a high-side or high side configured switch.

7. The driving circuit of claim 1, wherein the power switch comprises a power MOSFET.

8. The driving circuit of claim 1, wherein the current path comprises at least one of the following components connected in series within said current path: a diode with an anode terminal turned to the output of the electro-inductive component and a cathode terminal turned to the control terminal of the power switch, a controlled switch, a capacitor, and a resistor.

9. The driving circuit of claim 1, further comprising a start-up circuitry arranged for providing a current to the electro-inductive component during an initialization phase.

10. The driving circuit of claim 1, further comprising at least a second controlled switch in series with the electro-inductive component of the load, and controlled to be open to generate the overvoltage at an output of said electro-inductive component.

11. A DC-DC converter comprising at least one inductor and a driving circuit as claimed in claim 1, arranged to drive at least one load having said inductor as the electro-inductive component.

12. The DC-DC converter of claim 11, having a Single Inductor Multiple Output, SIMO, topology.

* * * * *